United States Patent
Aufiero

[11] Patent Number: 5,539,966
[45] Date of Patent: Jul. 30, 1996

[54] MACHINING HEAD FOR MACHINING BOARDS

[75] Inventor: Giacomo Aufiero, Castellamonte, Italy

[73] Assignee: Pluritec Italia S.p.A., Borgomanero, Italy

[21] Appl. No.: 334,663

[22] Filed: Nov. 4, 1994

[30] Foreign Application Priority Data

Nov. 5, 1993 [IT] Italy ............... TO93A0831

[51] Int. Cl.⁶ ............... B23Q 1/08; B23C 1/027; B23B 39/00
[52] U.S. Cl. ............... 29/26 A; 408/234; 409/230
[58] Field of Search ............... 409/235, 184, 409/183, 185, 204, 230, 218, 216, 214, 211, 231, 235, 241, 201, 233; 29/26 A, 57; 408/234, 238, 236, 31, 20

[56] References Cited

U.S. PATENT DOCUMENTS

| | | | |
|---|---|---|---|
| 4,982,831 | 1/1991 | Arao | 198/617 |
| 5,078,558 | 1/1992 | Arai | 409/233 |

FOREIGN PATENT DOCUMENTS

| | | |
|---|---|---|
| 0287071 | 10/1988 | European Pat. Off. . |
| 0362781 | 4/1990 | European Pat. Off. . |
| 0477766 | 4/1992 | European Pat. Off. . |
| 0563862 | 10/1993 | European Pat. Off. . |
| 201398 | 7/1983 | Germany ............... 409/230 |
| 3539662 | 5/1987 | Germany . |
| 3719167 | 11/1988 | Germany . |
| 8706167 | 10/1987 | WIPO . |

OTHER PUBLICATIONS

IBM Technical Disclosure Bulletin, vol. 31, No. 11, Apr. 1989, New York, US, pp. 242–243.

*Primary Examiner*—William Briggs
*Attorney, Agent, or Firm*—Kenyon & Kenyon

[57] ABSTRACT

A machining head presenting a hollow body in turn presenting a first crosspiece with a seat for supporting in sliding manner a motor-driven tool spindle. The body also presents a second crosspiece fitted with means for axially displacing the spindle which may be of different lengths and is driven by an electric motor via a screw-nut screw pair located between the second crosspiece and a third crosspiece connected removably to the spindle. The second crosspiece presents an end portion pivoting by means of a pin on an appendix of the hollow body, and is fitted to the body by means of a pair of locating pins and a pair of screws. By disconnecting the third crosspiece from the spindle and rotating the second crosspiece about the pin, the spindle may be changed without removing the machining head from the machine. The locating pins are removed from their respective seats by means of a key in the form of a screw and normally housed in a seat on the crosspiece.

15 Claims, 4 Drawing Sheets

MACHINING HEAD FOR MACHINING BOARDS

BACKGROUND OF THE INVENTION

The present invention relates to a machining head for mechanically machining boards, in particular printed circuit boards.

Such machining may include milling, e.g. for edging the boards, and drilling, e.g. in points arranged according to a given grid pattern, which operations may both be performed on the same machine using two different tools: a cutter and drill respectively. As each tool requires a different spindle, however, in terms of power, speed, etc., machines are normally designed to fit two sets of machining heads, one each for drilling and milling, which obviously makes for greater expense.

Known machining heads must be removed from the machine for repair or replacing worn parts, particularly the tool spindle, which is a complex operation requiring skilled personnel and therefore involving a good deal of time and expense.

SUMMARY OF THE INVENTION

It is an object of the present invention to provide a machining head of the aforementioned type, which provides for troublefree removal, part replacement and assembly, is extremely low-cost, and provides for overcoming the aforementioned drawbacks typically associated with known machining heads.

According to the present invention, there is provided a machining head for mechanically machining boards, in particular printed circuit boards, and comprising a hollow body presenting a first crosspiece with a seat for supporting a motor-driven tool spindle in sliding manner, said body also presenting a second crosspiece fitted with means for axially displacing said motor-driven spindle in said seat; characterized in that said second crosspiece comprises an end portion pivoting on said hollow body; removable means being provided for rigidly fitting at least another portion of said second crosspiece to said hollow body.

According to a further characteristic of the invention, the length of said motor-driven spindle may vary; a third crosspiece being fitted to the spindle via removable spacer means of a length corresponding to that of the spindle, thus enabling different types of spindles to be fitted to the machining head.

BRIEF DESCRIPTION OF THE DRAWINGS

A preferred, non-limiting embodiment of the present invention will be described by way of example with reference to the accompanying drawings, in which.

DETAILED DESCRIPTION OF THE INVENTION

Figure 1:
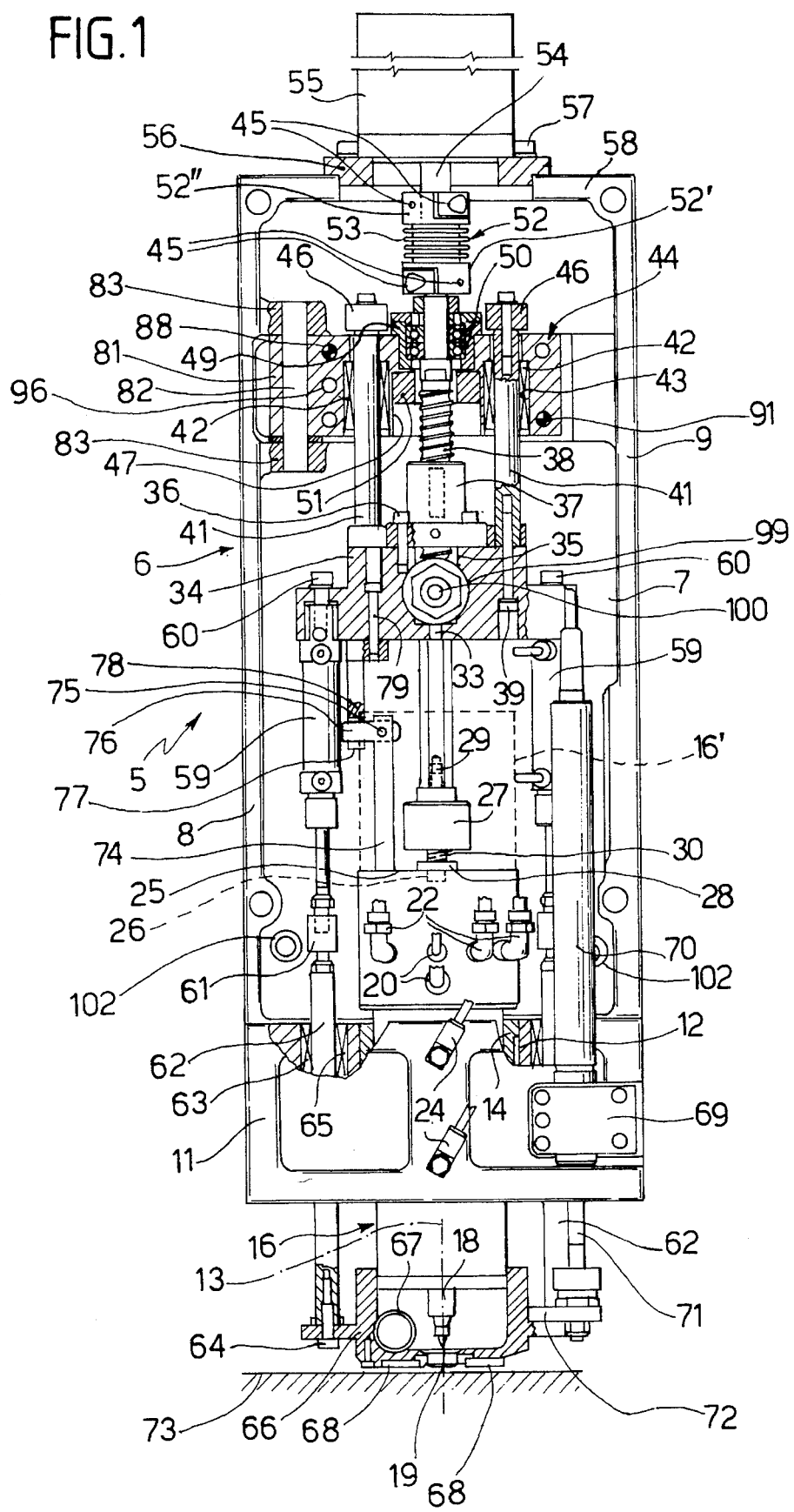
FIG. 1 shows a partially-sectioned front view of a machining head for mechanically machining boards in accordance with the present invention.
Figure 3:
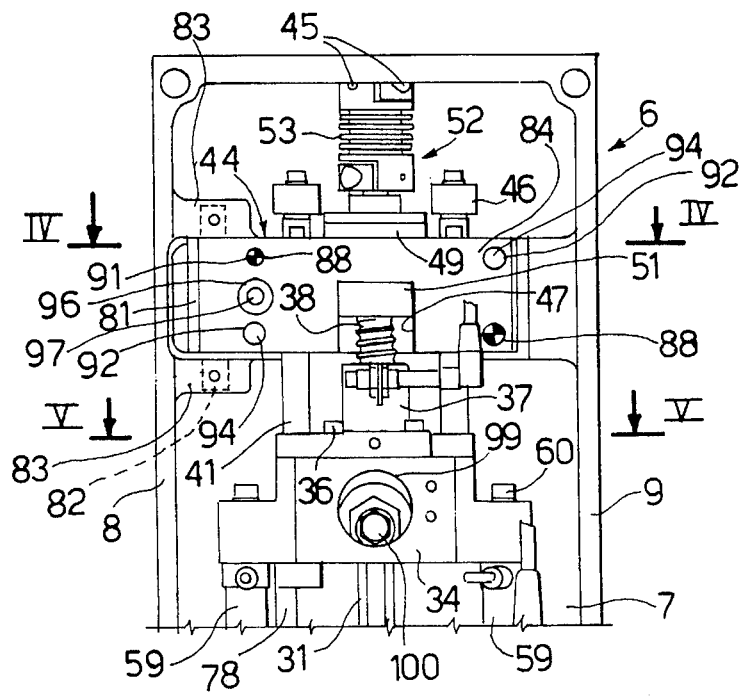
FIG. 3 shows a front view of part of the head.
Figure 4:
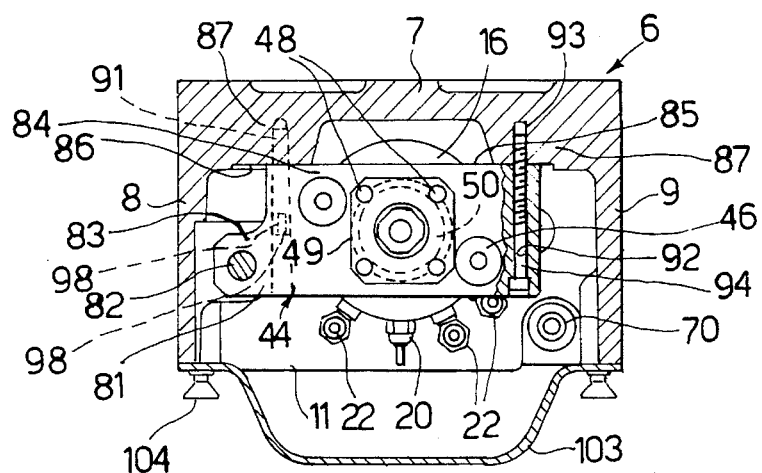
FIG. 4 shows a section along line IV—IV in FIG. 3.
Figure 5:
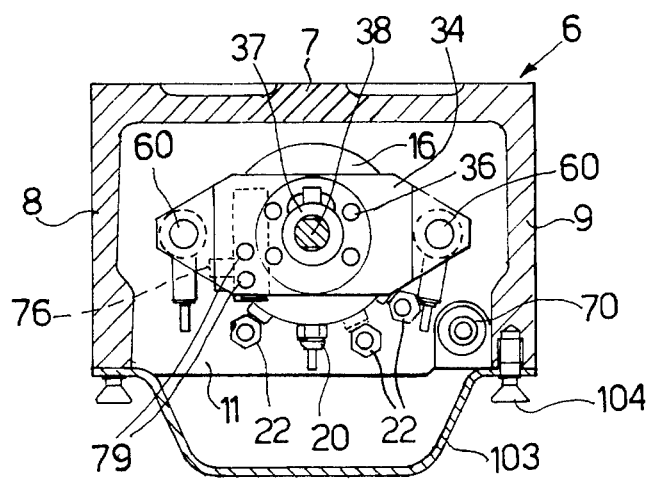
FIG. 5 shows a section along line V—V in FIG. 3.

Number 5 in FIG. 1 indicates a machining head for mechanically machining, i.e. drilling or milling, printed circuit boards, and comprising an aluminium alloy body 6 with a substantially C-shaped horizontal section including a bottom wall 7 (FIGS. 3 and 4) and two lateral walls 8 and 9.

Figure 2:
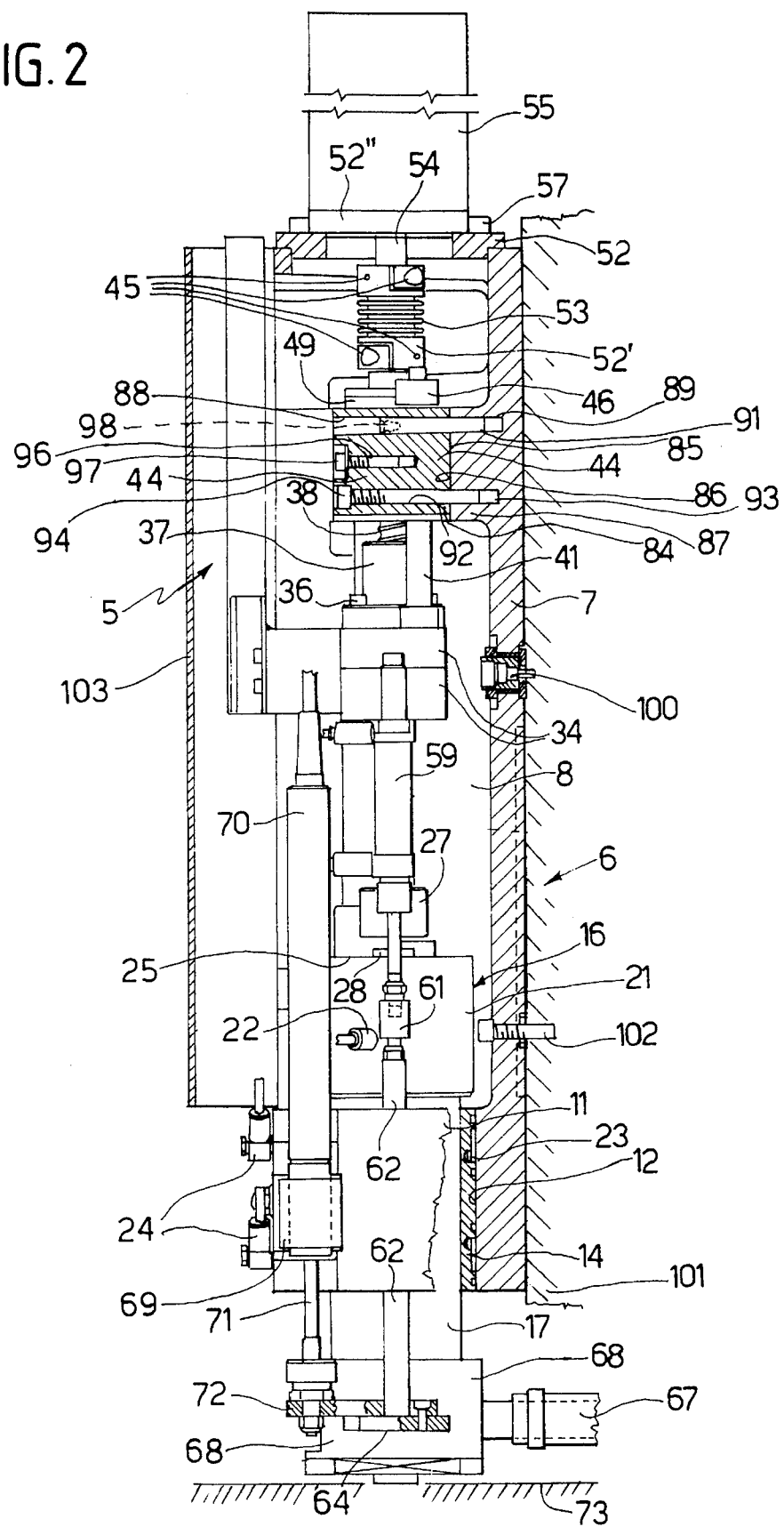
FIG. 2 shows a partially-sectioned side view of the FIG. 1 head.

At the bottom, body 6 presents a crosspiece 11 (FIGS. 1 and 2) in turn presenting a cylindrical cavity 12, the axis 13 of which forms the vertical axis of head 5. Cylindrical cavity 12 is fitted inside in known manner with a bush 14 in turn fitted inside with an axially-sliding motor-driven tool spindle 16.

As is known, motor-driven spindle 16 comprises a cylindrical sleeve 17 which also forms the stator of a high-speed electric motor, the rotor of which is connected at the bottom to a self-centering collet 18 in which a tool 19 is inserted and rotated at high speed.

The electric motor is supplied over cables connected to two fittings 20 on a body 21 forming one piece with sleeve 17. Body 21 also presents the usual fittings 22 for a compressed air conduit and two conduits for the coolant of spindle 16; and bush 14 presents conduits 23 connected by means of two fittings 24 on crosspiece 11 to a compressed air generator for forming a cylindrical air-cushion guide for sleeve 17 of spindle 16.

An aligning joint 27 is fitted removably to the top wall 25 of body 21 by means of a ring nut 28 comprising a threaded element 26 screwed inside a seat in wall 25, and a further threaded element 30 connected to joint 27 which in turn presents a threaded pin 29 engaging an axial seat in a spacer bar 31.

Figure 6:
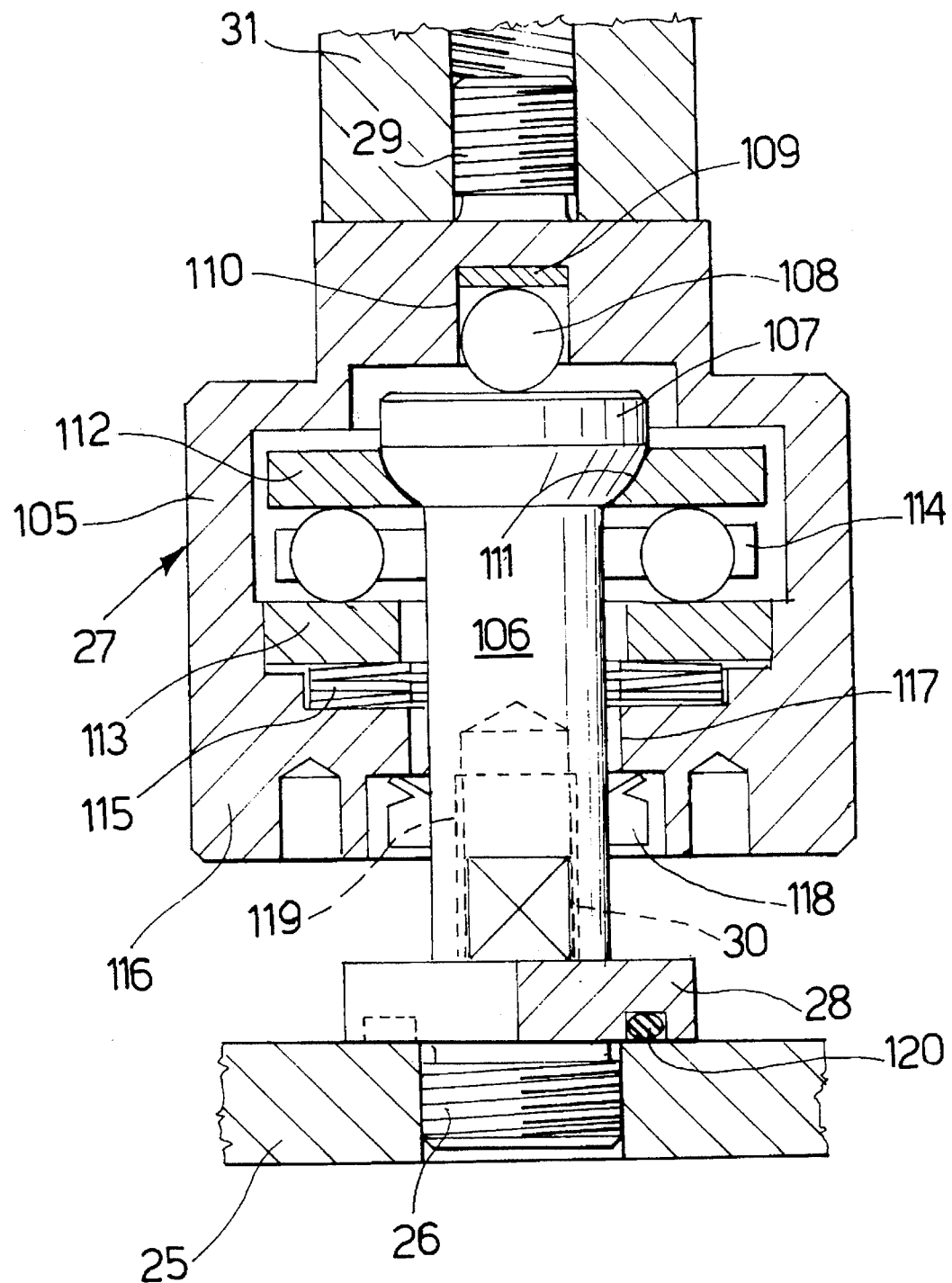
FIG. 6 shows a mid section of a detail on the head.

More specifically, joint 27 comprises a cup-shaped body 105 (FIG. 6) forming one piece with threaded pin 29; and an oscillating pin 106 with a head 107 resting on a ball 108 in turn resting on a disk 109 housed inside a cavity 110 in body 105. Head 107 also presents a surface 111 in the form of a spherical portion, the center of which lies at the point of contact between head 107 and ball 108.

Surface 111 of head 107 engages a conical seat in a thrust bearing 112; and, between thrust bearing 112 and a second thrust bearing 113, there is provided a ball bearing 114 loaded by a Belleville washer 115 compressed adjustably by a contrasting threaded ring nut 116.

Ring nut 116 presents a hole 117 for the passage of, and much larger in diameter than, oscillating pin 106 which is thus allowed a certain amount of inclination in relation to and in any angular direction about axis 13. Hole 117 is fitted with a sealing ring 118 for the lubricant fed into body 105 for lubricating the moving parts inside.

At the bottom end, pin 106 presents a threaded hole 119 engaged by threaded element 30 of ring nut 28 which is secured against wall 25 by a retaining ring 120. In the event of any misalignment of spacer 31 and spindle 16, head 107 of pin 106 rotates inside the conical seat in thrust bearing 112, while at the same time remaining in contact with ball 108, and hole 117 permits pin 106 to tilt by an angle corresponding to the amount of misalignment involved.

The top end of bar 31 presents a threaded portion 33 (FIG. 1) by which it engages an axial seat in a movable crosspiece 34. By means of screws 36, crosspiece 34 is fitted with a recirculating-ball nut screw 37 engaged by a screw 38 for moving spindle 16 vertically; and as nut screw 37 moves upwards, screw 38 penetrates inside a dead hole 35 in crosspiece 34.

Crosspiece 34 is also fitted removably, by means of screws 39, with two guide columns 41 parallel to axis 13 and each guided by a ball bush 42 fitted inside a respective cavity 43 in an upper crosspiece 44. The top end of each column 41 is fitted with a removable pad 46 of elastomeric material, which forms the bottom limit stop of each column 41 and hence also of crosspiece 34.

Crosspiece 44 presents a central opening 47 in which is fitted, by means of screws 48 (see also FIG. 4), a bush 49 housing a pair of rolling bearings 50 for supporting the top end of screw 38 in rotary manner. Central opening 47 also houses an annular pad 51 of elastomeric material, which forms the top limit stop of nut screw 37 and hence also of crosspiece 34.

By means of a known elastic joint 52, screw 38 is connected to the shaft 54 of an electric motor 55 by which it is operated; and joint 52 comprises two hubs 52' and 52| between which is provided an elastic bellows type body 53, and which are connected removably by means of pairs of screws 45 to the top end of screw 38 and to the bottom end of shaft 54 respectively.

Motor 55 is fitted by means of screws 57 to an adapting flange 56 in turn fitted to the top wall 58 of body 6, and is a reversible type controlled in known manner by a numerical-control unit according to the machining program.

Crosspiece 34 is also fitted by means of screws 60 with two pneumatic actuators 59, the rod of each of which is connected by a joint 61 to a respective rod 62. The two rods 62 are guided in sliding manner by two ball bushes 63 housed in respective cavities 65 in crosspiece 11, and are fitted at the bottom end, by means of screws 64, with a board holder 66 presenting a chip suction tube 67 and a photoelectric detector 68 for detecting the tip of tool 19 for machining control purposes.

By means of a plate 69, crosspiece 11 is also fitted with a linear position transducer 70 comprising a cursor 71 moving in relation to a scale and fitted by a plate 72 to the adjacent rod 62. Transducer 70 provides for accurately controlling the drilling depth of the pack of boards on worktable 73, as described in Italian Patent Application n. 67620 A-90 filed on 17 Oct., 1990, by the present Applicant.

Finally, body 21 of sleeve 17 is fitted with a rod 74 in turn fitted removably by means of a screw 75 with a cylindrical pin 76. Pin 76 engages a recess 77 in a bracket 78 fitted by screws 79 to the bottom wall of crosspiece 34 and which prevents sleeve 17 from rotating in reaction to rotation of the motor of spindle 16.

According to the present invention, upper crosspiece 44 comprises an end portion 81 pivoting on a pin 82 fitted inside a hole in a pair of appendixes 83 projecting from wall 8 inwards of hollow body 6. Crosspiece 44 also comprises a portion 84 (FIG. 4) having a vertical wall 85 which is placed against the vertical wall 86 of a pair of projections 87 of rear wall 7 to fit crosspiece 44 to body 6.

More specifically, portion 84 of crosspiece 44 presents two holes 88 (FIGS. 1–3) aligned respectively with two holes 89 in projections 87 for respectively receiving two locating pins 91. Both holes 88, 89 and pins 91 are slightly conical for ensuring perfect positioning of crosspiece 44 when pin 91 is forced inside the two holes 88 and 89. Portion 84 of crosspiece 44 also presents two holes 92 aligned respectively with two threaded seats 93 in projections 87 for fitting crosspiece 44 to wall 7 by means of respective screws 94.

Holes 88 and 92 of crosspiece 44 and hence holes 89 and seats 93 of projections 87 are so arranged as to form the points of a quadrilateral, in particular a rectangle. Advantageously, holes 88, 89 for pins 91 are located at the two opposite points of one diagonal of the rectangle, and holes 92 and seats 93 for screws 94 at the two opposite points of the other diagonal of the rectangle.

Crosspiece 44 also presents a seat 96 housing a key 97 for removing pins 91 from holes 88 and 89. More specifically, each pin 91 presents a threaded axial hole 98 (FIG. 4), and key 97 comprises a screw designed to screw inside hole 98 for inserting or removing pin 91 in holes 88 and 89.

Movable crosspiece 34 presents a horizontal opening 99 (FIG. 3) permitting access to a screw 100 (see also FIG. 2) for fitting wall 7 of body 6 to the plate 101 of the carriage or crosspiece by which head 5 is moved along the Y axis. Wall 7 is also fitted to plate 101 by a further two screws 102 over crosspiece 11; and screw 100 provides for adjusting, on plate 101, the uprightness of rear wall 7 of body 6. Finally, machining head 5 comprises a cover 103 fitted to walls 8 and 9 of body 6 by means of fast-fit elements 104.

FIG. 1 shows a motor-driven spindle 16 for receiving a drill 19 and therefore presenting a given length. Bush 14 of head 5, however, is designed to house other spindles of the same diameter but different length, and for the same or different type of tool.

The dotted line in FIG. 1 indicates, schematically, another motor-driven spindle 16' for receiving a cutter requiring greater power as compared with drill 19. Spindle 16' is therefore much longer than spindle 16, and obviously presents a spacer 31 and a rod 74 of a length corresponding to its own.

To change a defective spindle 16 with another of the same type, or a spindle 16 with a spindle 16' of a different length for a different machining operation, head 5 need not be removed from plate 101 of the carriage or crosspiece.

To change the spindle, cover 103 is first removed; the electric cables are disconnected from fittings 20 on body 21 of spindle 16, and the air and water conduits from respective fittings 22; screws 45 of hubs 52' and 52" of joint 52 are unscrewed to disconnect screw 38 from shaft 54 of motor 55; and joint 52 is raised to free the top end of screw 38.

At this point, the two screws 60 are unscrewed to free crosspiece 34 from actuators 59 which may be lowered along the respective piston rods; spacer bar 31 is rotated to unscrew element 33 and free crosspiece 34 from bar 31; and screw 75 is unscrewed to remove pin 76 from rod 74.

Key 97 is then removed from seat 96 and inserted inside threaded hole 98 of each pin 91 to remove it from holes 88, 89; screws 94 are unscrewed from seats 93 and removed from respective holes 92, so that crosspiece 44 is secured to body 6 solely by pin 82 and may thus be rotated together with columns 41 and crosspiece 34; and the spindle 16 assembly to be changed is removed together with joint 27, spacer bar 31 and rod 74.

After removing spindle 16, both rod 74 and the spacer bar 31 and joint 27 assembly may be removed and assembled on the new spindle 16 if this is the same length as the one removed. The new spindle 16 is then assembled performing the above operations in reverse.

In the event spindle 16 is replaced with a spindle 16' of a different length, spindle 16' must first be fitted with a rod 74 and spacer bar 31 of the same length. Crosspiece 34 is movable freely in the axial direction to make room for the new spindle 16' by columns 41 sliding freely inside bushes 42, and nut screw 37 freely rotating screw 38.

The advantages of the present invention are as follows. Spindle 16 on head 5 may be replaced rapidly without removing head 5 from the machine; storage of a head 5 for each type of spindle 16 is no longer necessary; and joint 27 provides for troublefree connection of spindle 16 to crosspiece 34.

Clearly, changes may be made to the machining head as described and illustrated herein without, however, departing from the scope of the present invention. For example, changes may be made to the form or structure of body 6, or to the connection of movable crosspiece 34 to board holder assembly 66, upper crosspiece 44 and spacer bar 31 of spindle 16.

I claim:

1. A machining head for mechanically machining boards, in particular printed circuit boards, and comprising a hollow body (6) presenting a first crosspiece (11) with a seat (14) for supporting a motor-driven tool spindle (16) in sliding manner, said body (6) also presenting a second crosspiece (44) fitted with means (38, 41) for axially displacing said motor-driven spindle (16) in said seat (14); characterized in that said second crosspiece (44) comprises an end portion (81) pivoting on said hollow body (6); removable means (91, 94) being provided for rigidly fitting at least another portion (84) of said second crosspiece (44) to said hollow body (6).

2. A machining head as claimed in claim 1, characterized in that said second crosspiece (44) pivots on a pin (82) fitted to at least one appendix (83) of said hollow body (6); said second crosspiece (44) comprising another portion (84) having a wall (85) resting against a wall (86) of projecting elements (87) of said hollow body (6).

3. A machining head as claimed in claim 1, characterized in that said removable means (91, 94) comprise at least one locating pin (91) engaging a pair of holes (88, 89) in said other portion (84) and in said projecting elements (87) respectively; and at least one assembly screw (94) engaging another hole (92) in said other portion (84) and screwed into a corresponding seat (93) in said projecting elements (87).

4. A machining head as claimed in claim 1, characterized in that said removable means (91, 94) comprise two locating pins (91) engaging two pairs of holes (88, 89) in said other portion (84) and in said projecting elements (87) respectively; two assembly screws (94) being provided for engaging another two holes (92) in said other portion (84) and screwed inside two corresponding seats (93) in said projecting elements (87).

5. A machining head as claimed in claim 4, characterized in that said holes (89) and said seats (93) in said projecting elements (87) are so arranged as to form the points of a quadrilateral.

6. A machining head as claimed in claim 5, characterized in that said quadrilateral is a rectangle; said holes (89) in said projecting elements (87) being located at the opposite points of one diagonal of said rectangle; and said seats (93) in said projecting elements (87) being located at the opposite points of the other diagonal of said rectangle.

7. A machining head as claimed in claim 3, characterized in that said second crosspiece (44) presents a seat (96) housing a key (97) for removing said pin (91) from said pair of holes (88, 89).

8. A machining head as claimed in claim 7, characterized in that said pin (91) presents a threaded axial hole (98); said key (97) comprising a threaded tip designed to screw into said threaded hole (98).

9. A machining head as claimed in claim 1, characterized in that said displacing means (38, 41) comprise the screw (38) of a screw-nut screw pair (38, 37) connected between an electric motor (55) and said motor-driven spindle (16); and at least two guide elements (41) for axially displacing said motor-driven spindle (16).

10. A machining head as claimed in claim 9, characterized in that said two guide elements each comprise a column (41) fitted to a third crosspiece (34) and sliding in a seat (41) in said second crosspiece (44); said screw (38) of said pair being connected to said motor (55) and rotating on said second crosspiece (44); and said nut screw (37) being fitted removably to said third crosspiece (34).

11. A machining head as claimed in claim 10, characterized in that said motor-driven spindle (16) may vary in length; said third crosspiece (34) being fitted to said motor-driven spindle (16) via removable spacer means (31) corresponding in size to the length of said motor-driven spindle (16).

12. A machining head as claimed in claim 11, characterized in that said spacer means comprise an axial bar (31); an aligning joint (27) being provided between said bar (31) and a wall (25) of said motor-driven spindle (16).

13. A machining head as claimed in claim 12, characterized in that said aligning joint (27) comprises a cup-shaped body (105) and an oscillating pin (106); said cup-shaped body (105) being connected removably to said bar (31); and said oscillating pin (106) being connected removably to a threaded element (30) of a ring nut (28) presenting a second threaded element (26) connected removably to said wall (25) of said motor-driven spindle (16).

14. A machining head as claimed in claim 13, characterized in that said oscillating pin (106) presents a head (107) having a spherical-portion surface (111) engaging a conical seat in a thrust bearing (112) housed in said cup-shaped body (105).

15. A machining head as claimed in claim 14, characterized in that the head (107) of said oscillating pin (106) also cooperates with a ball (108) also housed in said cup-shaped body (105); said thrust bearing (112) rotating on a rolling bearing (114) preloaded by a Belleville washer (115).

* * * * *